US011860463B2

(12) United States Patent
Kawawa et al.

(10) Patent No.: US 11,860,463 B2
(45) Date of Patent: Jan. 2, 2024

(54) HEAD-UP DISPLAY

(71) Applicant: Maxell, Ltd., Kyoto (JP)

(72) Inventors: Eiji Kawawa, Kyoto (JP); Toshinori Sugiyama, Kyoto (JP); Tomoki Yamamoto, Kyoto (JP); Tatsuya Nakazawa, Kyoto (JP); Keisuke Sawada, Kyoto (JP); Akio Misawa, Kyoto (JP); Nozomu Shimoda, Kyoto (JP)

(73) Assignee: MAXELL, LTD., Kyoto (JP)

( * ) Notice: Subject to any disclaimer, the term of this patent is extended or adjusted under 35 U.S.C. 154(b) by 266 days.

(21) Appl. No.: 17/598,295

(22) PCT Filed: Oct. 28, 2019

(86) PCT No.: PCT/JP2019/042203
§ 371 (c)(1),
(2) Date: Sep. 27, 2021

(87) PCT Pub. No.: WO2020/194829
PCT Pub. Date: Oct. 1, 2020

(65) Prior Publication Data
US 2022/0179259 A1    Jun. 9, 2022

(30) Foreign Application Priority Data
Mar. 28, 2019   (JP) .................................. 2019-063109

(51) Int. Cl.
*G02F 1/1333* (2006.01)
*G02B 27/01* (2006.01)
(Continued)

(52) U.S. Cl.
CPC ... *G02F 1/133385* (2013.01); *G02B 27/0101* (2013.01); *G02B 27/0149* (2013.01);
(Continued)

(58) Field of Classification Search
CPC .......... G02F 1/133385; H05K 7/20963; G02B 2027/0192–0198; B60K 2370/1529
See application file for complete search history.

(56) References Cited

U.S. PATENT DOCUMENTS

2017/0329181 A1   11/2017  Pierre
2017/0363866 A1   12/2017  Murzyn
(Continued)

FOREIGN PATENT DOCUMENTS

| JP | 2005-148658 A | 6/2005 |
| JP | 2006-251600 A | 9/2006 |

(Continued)

OTHER PUBLICATIONS

International Search Report and Written Opinion dated Jan. 7, 2020, received for PCT Application PCT/JP2019/042203, Filed on Oct. 28, 2019, 8 pages including English Translation.

*Primary Examiner* — Mariceli Santiago
(74) *Attorney, Agent, or Firm* — XSENSUS LLP

(57) ABSTRACT

A HUD includes a plate that connects an emission-surface of the LCD and a heat sink, is formed of a material having a higher thermal conductivity than air, and is provided with an emission-surface exhaust heat path that is formed to: include a holding region fixed to a periphery of the emission-surface directly or via a material having a higher thermal conductivity than air, and an intermediate region connecting the holding region and the heat sink; connect an end portion, which is opposite to the holding region, of the intermediate region with the heat sink directly or via a material having a higher thermal conductivity than air; extend from the emission-surface to the heat sink via the plate; and have a thermal gradient greater than that of a heat transfer path for transferring heat from the emission-surface to the heat sink by using air as a medium.

4 Claims, 7 Drawing Sheets

(51) Int. Cl.
*H05K 7/20* (2006.01)
*B60K 35/00* (2006.01)

(52) U.S. Cl.
CPC .......... *H05K 7/20963* (2013.01); *B60K 35/00* (2013.01); *B60K 2370/1529* (2019.05); *B60K 2370/166* (2019.05); *B60K 2370/167* (2019.05); *B60K 2370/23* (2019.05)

(56) References Cited

U.S. PATENT DOCUMENTS

| | | |
|---|---|---|
| 2018/0259807 A1 | 9/2018 | Yuuki et al. |
| 2019/0018241 A1 | 1/2019 | Haruyama et al. |
| 2019/0265472 A1 * | 8/2019 | Sugiyama ............ G02B 6/0025 |

FOREIGN PATENT DOCUMENTS

| | | | | |
|---|---|---|---|---|
| JP | 2014-202883 A | 10/2014 | | |
| JP | 2017-161661 A | 9/2017 | | |
| JP | 2017-537354 A | 12/2017 | | |
| JP | 2018-36379 A | 3/2018 | | |
| JP | 2018-60006 A | 4/2018 | | |
| WO | WO-2017090336 A1 * | 6/2017 | ............. | B60K 35/00 |
| WO | 2017/126455 A1 | 7/2017 | | |
| WO | WO-2017203916 A1 * | 11/2017 | ............. | B60K 35/00 |
| WO | WO-2018008236 A1 * | 1/2018 | ............. | B60K 35/00 |

\* cited by examiner

HEAD-UP DISPLAY

CROSS-REFERENCE TO RELATED APPLICATIONS

The present application is based on PCT filing PCT/JP2019/042203, filed Oct. 28, 2019, which claims priority to JP 2019-063109, filed Mar. 28, 2019, the entire contents of each are incorporated herein by reference.

TECHNICAL FIELD

The present invention relates to a head up display.

BACKGROUND ART

In a vehicle such as an automobile, generally, information such as vehicle speed and engine speed is displayed on an instrument panel within a dashboard. A screen of a car navigation system or the like is displayed on a display incorporated in the dashboard or installed on the dashboard. At the time of visually recognizing the information thereon, a driver needs to largely move his or her line of sight, and accordingly, there has been known a head up display (Head Up Display, it may be referred to as "HUD" in the following) that projects information such as vehicle speed and car navigation instructions onto a windshield or the like to display a virtual image thereon.

In an automobile parked for a long time under the blazing sun, a temperature on a surface of a liquid crystal panel (LCD panel) provided in the HUD rises above a heat resistant temperature of a polarizing plate, and a possibility of damage therein increases. Therefore, it is necessary to cool the LCD panel. In particular, when the sunlight retrogrades an emission optical path of an image light of the HUD and enters a housing of the HUD, the sunlight is condensed by a concave mirror and a lens arranged along the emission optical path of the image light, and the surface temperature of the LCD panel or the temperature of the environment in which the LCD panel is installed rises, which may exceed the heat resistant temperature of the polarizing plate on the surface of the LCD panel.

With this regard, as a technique for improving heat resistance of a display device, Patent Literature 1 discloses "a display unit comprises: a display member including a display surface that emits display light corresponding to an image; a heat storage member having a thermal conductivity that is arranged at a position on the display surface of the display member not blocking the display light passing through a display area; and a thermally conductive adhesion layer that is provided between the display member and heat storage member and composed of a thermally conductive adhesive" (excerpted from Abstract).

CITATION LIST

Patent Literature

Patent Literature 1: JP-A-2018-36379

SUMMARY OF INVENTION

Technical Problem

Not only the sunlight entering the HUD will result in rise in the temperature of the display surface within the HUD. A liquid crystal panel is generally used as a display device, and in the case of using an LED as a backlight, heat generated when the LED emits light also increases the temperature of the liquid crystal panel. Accordingly, in order to improve the heat resistance of the liquid crystal panel within the HUD, it is necessary to consider an influence of the heat generated by the backlight in addition to an influence of the sunlight.

With this regard, a technique for dissipating, from the heat sink, the heat generated from the backlight has been known. Since the HUD is accommodated in a dashboard and used, it is limited to the size that can be accommodated in a narrow dashboard space. Accordingly, there has been a demand to improve the heat resistance of the liquid crystal panel and secure the heat dissipation performance of the backlight without making the size of the HUD exceed the limitation.

However, Patent Literature 1 only aims to improve the heat resistance of the display surface, and thus cannot satisfy the demand mentioned above.

The present invention has been made in view of the problems above, and an object thereof is to provide an HUD that can improve heat resistance of a liquid crystal panel and secure heat dissipation of a backlight while downsizing a body thereof.

Solution to Problem

In order to solve the problems above, the present invention includes the technical features described in the scope of claims. As one aspect of the present invention, provided is a head up display for displaying a virtual image to a driver, the head up display comprising: an image display device that includes a backlight, a liquid crystal panel, and a plate for holding a periphery of an emission surface, from which an image light is emitted, provided on the liquid crystal panel; a virtual image optical system that includes a lens for transmitting the image light emitted from the liquid crystal panel, and a concave mirror for reflecting the image light to form an optical path of the image light; a housing that accommodates the virtual image optical system; and a heat sink that dissipates heat generated from the backlight, the heat sink being arranged in a state where at least a portion thereof is exposed to an outside of the housing, the plate being formed of a material having a thermal conductivity higher than that of air and provided with an emission surface exhaust heat path, and the emission surface exhaust heat path being formed to: include a holding region fixed to the periphery of the emission surface directly or via a material having a thermal conductivity higher than that of air, and an intermediate region connecting the holding region and the heat sink; connect an end portion, which is opposite to the holding region, of the intermediate region with the heat sink directly or via a material having a thermal conductivity higher than that of air; extend from the emission surface to the heat sink via the plate; and have a thermal gradient greater than that of a heat transfer path for transferring the heat from the emission surface to the heat sink by using air as a medium.

Advantageous Effects of Invention

According to the present invention, it is possible to provide an HUD that can improve heat resistance of a liquid crystal panel and secure heat dissipation of a backlight while downsizing a body thereof. The objects, configurations, and effects other than those described above will be clarified by explanation of the embodiment below.

DESCRIPTION OF EMBODIMENTS

Hereinafter, an embodiment of the present invention will be described with reference to the drawings. Throughout the drawings for explaining the embodiment, basically, the same members are provided with the same reference signs, and repetitive explanation therefor will be omitted. On the other hand, there are cases where a portion provided with a reference sign in a drawing is referred in other drawings with the same reference sign without being illustrated therein again. Furthermore, in the following embodiment, an example in which a head up display (HUD) is installed in a vehicle such as an automobile will be described, meanwhile, the present invention is also applicable to other vehicles such as trains and aircrafts. In addition, the present invention is also applicable to an HUD used for a purpose other than vehicles.

Figure 1:
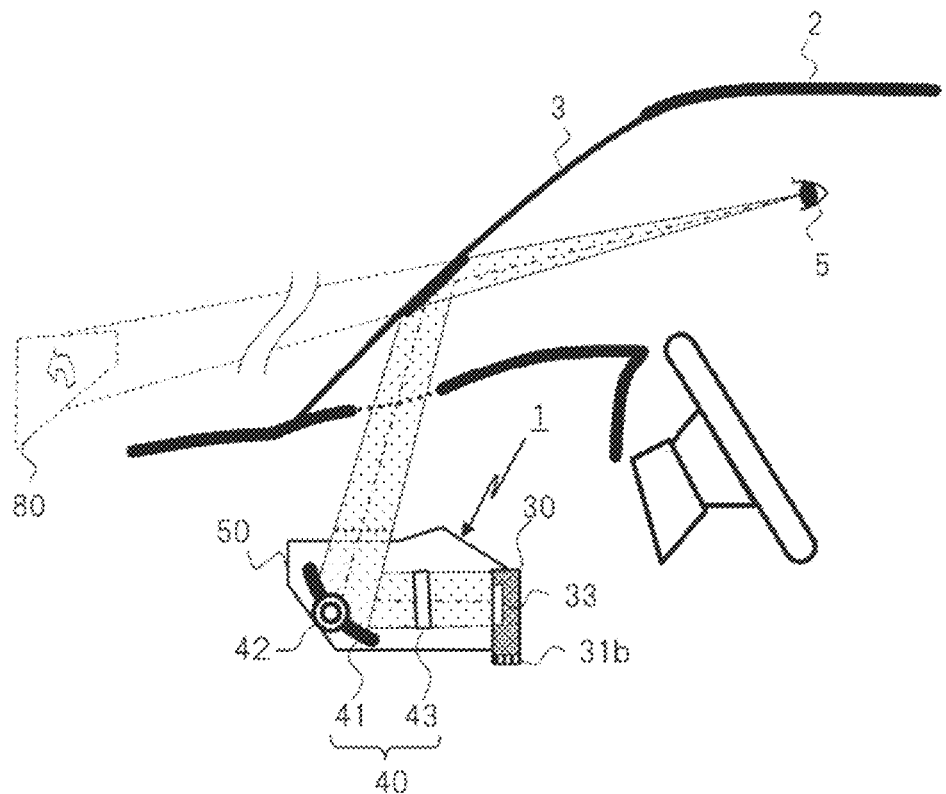
FIG. 1 is a schematic configuration view of a head up display (HUD) according to the present embodiment.
Figure 2:
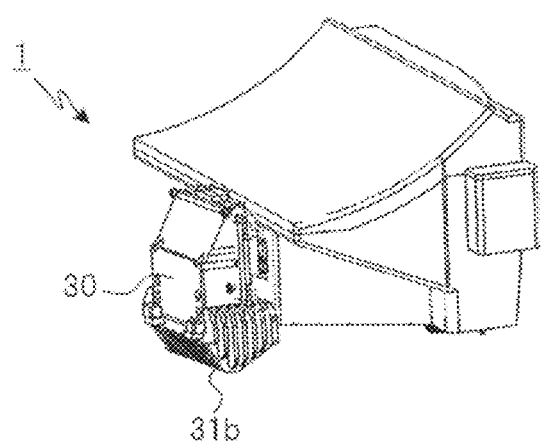
FIG. 2 is a perspective view of an appearance example of an HUD, especially showing an outer housing thereof.

FIG. 1 is a schematic configuration view of a head up display (HUD) 1 according to the present embodiment. FIG. 2 is a perspective view of an appearance example of the HUD 1, especially showing an outer housing 50.

As illustrated in FIG. 1, the HUD 1 includes an image display device 30 having a liquid crystal panel, a virtual image optical system 40 having a lens unit 43 and a concave mirror 41 which enlarge image light emitted from the image display device 30, and the outer housing 50 that accommodates the virtual image optical system 40.

The image display device 30 is attached to the outer housing 50 in a state where at least a portion of a heat sink 31b is exposed to the outside of the outer housing 50 (see FIG. 2). The heat sink 31b may be configured such that fins 31b2 (see FIG. 4) are exposed to the outside of the outer housing 50 while a heat transfer plate 31b1 is accommodated in the outer housing 50 (see FIG. 5), or the heat transfer plate 31b1 and the fins 31b2 are exposed to the outside of the outer housing 50 (see FIG. 8).

The concave mirror 41 is rotated by a mirror drive unit 42, thereby changing an angle for reflecting the image light toward a wind shield 3. The image light is reflected by the concave mirror 41, and then projected on the windshield 3 of a vehicle 2. The eye of the driver 5 receives the image light projected on the wind shield 3, which causes the driver 5 to visually recognize a virtual image 80 in front of the vehicle 2.

Here, a projection target member is not limited to the wind shield 3 as long as being able to receive the image light projection, and it may be such as a combiner. Furthermore, the present embodiment uses, as the image display device 30, a projector and a Liquid Crystal Display (LCD) having a backlight 31a.

The lens unit 43 for adjusting an optical distance between the concave mirror 41 and the image display device 30 is provided between the concave mirror 41 and the image display device 30. Accordingly, along an emission direction of the image light from the image display device 30, the lens unit 43 and the concave mirror 41 are arranged in order nearest from the image display device 30 to form the virtual image optical system 40, and accommodated in the inside of the outer housing 50.

Figure 3:
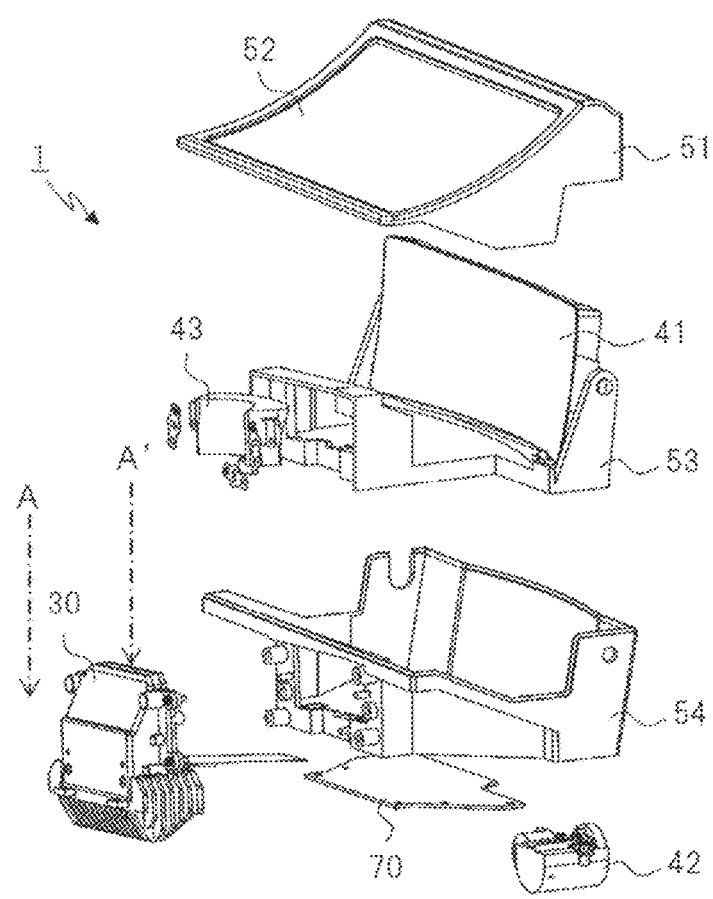
FIG. 3 is a perspective view illustrating a state where the HUD of FIG. 2 is disassembled into components.

FIG. 3 is a perspective view illustrating a state where the HUD 1 of FIG. 2 is disassembled into components.

As illustrated in FIG. 3, an optical component holding member 53 of the HUD 1 is accommodated in an outer case 54, and furthermore, an upper part of the HUD 1 is covered by an outer cover portion 51. The outer case 54 and the outer cover portion 51 form the outer housing 50 of the HUD 1 illustrated in FIG. 1. The image display device 30 is mounted to an opening provided on the outer case 54.

The outer cover portion 51 has an opening through which the image light is emitted toward the wind shield 3, and the opening is covered with an antiglare plate 52 (glare trap).

The optical component holding member 53 is a member for holding the concave mirror 41 and the lens unit 43.

The outer case 54 may include a main substrate 70 on which a control circuit for controlling the backlight 31a (see FIG. 4) and its operation is mounted, and other components such as the mirror drive unit 42 having a motor. The outer case 54 is provided with an attachment and detachment mechanism such as screw holes and an opening through which the image light enters, so that the image display device 30 can be attached thereto and detached therefrom.

In the present embodiment, the image display device 30 is modularized, thereby making it possible to be integrally attached and detached with respect to the outer case 54 by such as screws. As a result, for example, only the image display device 30 can be replaced without removing or disassembling the HUD 1 itself. Furthermore, since the image display device 30 is attached to the HUD 1 in a state where the heat sink 31b is exposed to the outside of the outer housing 50 of the HUD 1, it is possible to improve the heat dissipation, and further obtain an advantageous effect of reduction in failure and degradation due to heat.

Figure 4:
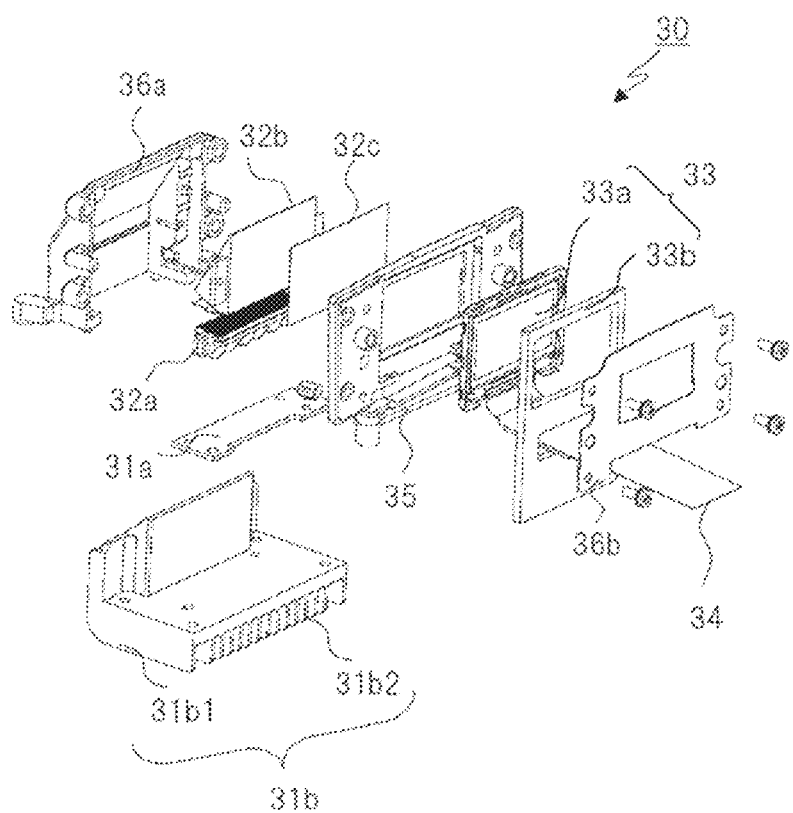
FIG. 4 is a perspective view illustrating a state where an image display device of FIG. 3 is disassembled into components.

FIG. 4 is a perspective view illustrating a state where the image display device 30 of FIG. 3 is disassembled into components. The image display device 30 is configured to display an image when a display element 33, such as the LCD panel, modulates light from the backlight 31a based on an image signal received from the main substrate 70 via a flexible cable 34. The displayed image is output to the virtual image optical system 40, and then the virtual image 80 that can be visually recognized by the driver 5 is generated.

As the backlight 31a, for example, a Light Emitting Diode (LED) which is a relatively inexpensive and reliable solid-state light source is used. The surface emission type backlight 31a is employed in order to increase the output. In the example of FIG. 4, the backlight 31a is mounted on the image display device 30 as an LED substrate.

The luminous efficiency of an LED relative to input power is 20% to 30% and the remainder is mostly converted to heat though it varies depending on emission colors. Accordingly, a frame 35 to which the backlight 31a is attached is formed of a member having a thermal conductivity higher than that of air (for example, a metal material such as aluminum). The heat sink 31b is connected to a lower end of the frame 35.

A light guide 32b and a diffusion plate 32c are used to efficiently guide divergent light from the backlight 31a to the display element 33. In this case, in order to prevent adhesion of dust or the like, for example, it is preferable to cover the entire of the light guide 32b, diffusion plate 32c, and display element 33 by using outer members 36a, 36b.

An LCD plate 33b of the display element 33 holds a periphery of a polarizing plate forming an emission surface 33a through which the image light is emitted.

Furthermore, in the example of FIG. 4, in order to capture the divergent light from the backlight 31a and convert it into parallel light, a plurality of light funnels 32a formed of such as collimator lenses is provided. An opening provided on each light funnel 32a for capturing the divergent light from the backlight 31a has, for example, a planer shape and optically connected to the backlight 31a with a medium interposed therebetween, or has a projecting shape and provided with a condensing function. Accordingly, the divergent light is made parallel as much as possible to reduce an incidence angle of light that enters on an interface of each light funnel 32a. As a result, after the divergent light passes through the light funnels 32a, the divergent angle can be further reduced, thereby making it easy to control the light from the light source passing toward the display element 33 after being reflected by the light guide 32b.

Furthermore, in order to improve the use efficiency of the divergent light from the backlight 31a, polarization conversion is performed by using a Polarizing Beam Splitter (PBS) at a connection portion between each light funnel 32a and the light guide 32b to convert the direction into a desirable polarization direction. Accordingly, it is possible to improve the efficiency of the light incident on the display element 33. In the case of aligning the polarization direction of the light from the light source in this manner, it is preferable to use a material having less birefringence as a material of the light guide 32b. Accordingly, when the direction of polarization is rotated and passes through the display element 33, for example, it is possible to suppress a problem of occurrence of coloring at the time of black display.

Figure 5:
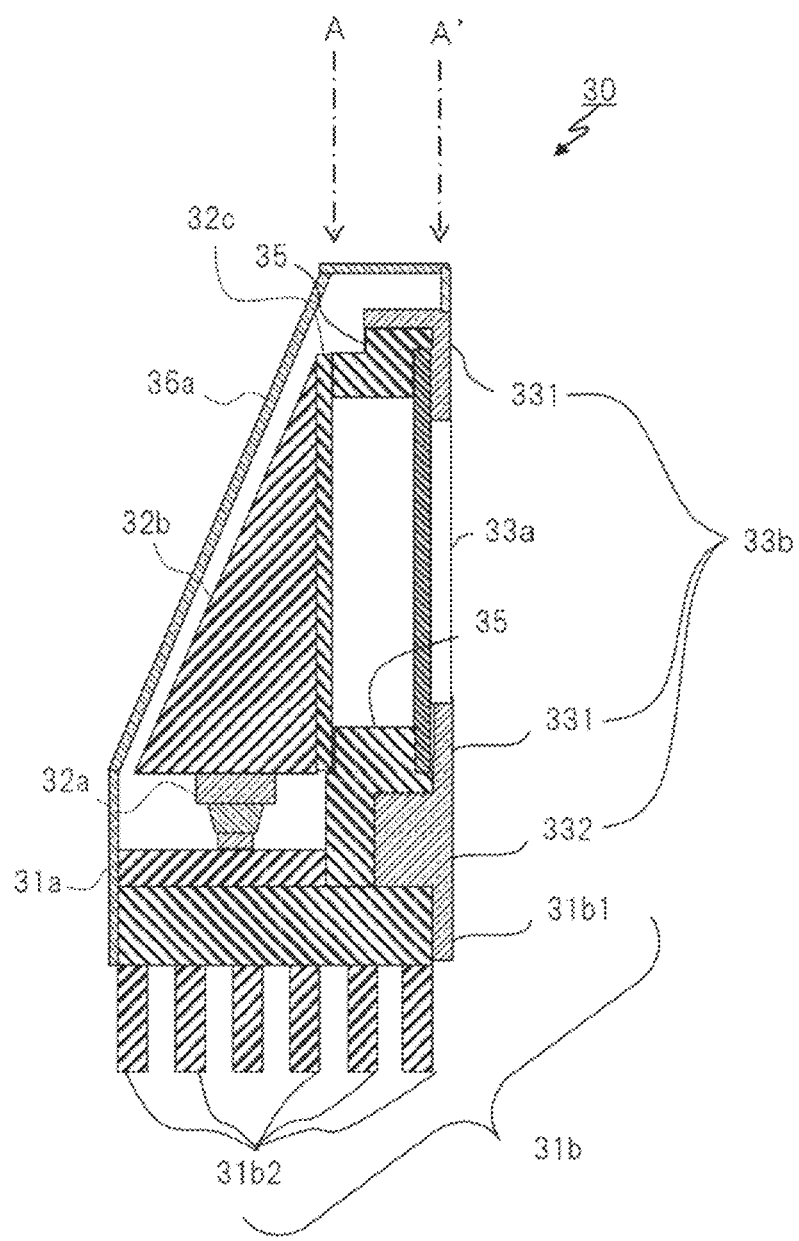
FIG. 5 is a cross-section view of an A-A' line of FIG. 3.

FIG. 5 illustrates an A-A' cross-section of FIG. 3 to show a structure of the image display device 30. In the image display device 30, the backlight 31a is arranged on the heat sink 31b, and the light funnels 32a are provided on the backlight 31a. The light emitted through the light funnels 32a is reflected by the light guide 32b toward the diffusion plate 32c, and enters the emission surface 33a.

In the image display device 30, the heat sink 31b is arranged at a position that is intersecting an extended surface of the plane including the emission surface 33a as well as off the optical path of the image light.

The display element 33 includes the plate-shaped LCD plate 33b provided with an opening whose size is allowed to include the emission surface 33a. The LCD plate 33b is arranged on a front surface of the emission surface 33a (emission direction of the image light). The LCD plate 33b is formed of a material having a thermal conductivity higher than that of air.

The LCD plate 33b includes a holding region 331 for holding the periphery of the polarizing plate that forms the emission surface 33a, and an intermediate region 332 for connecting the holding region 331 and the heat sink 31b.

Figure 8:
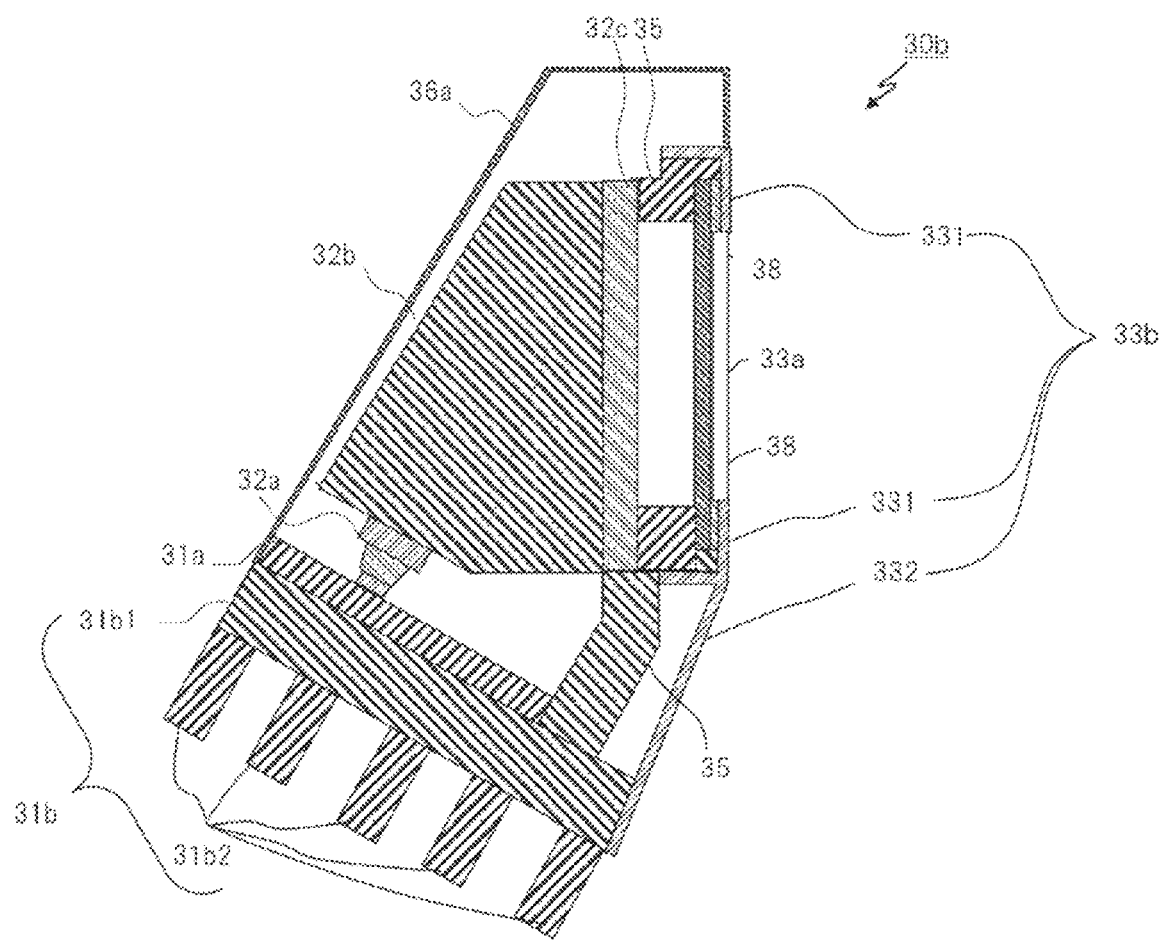
FIG. 8 is a cross-section view of another example of an image display device including an LCD plate (heat generation countermeasure components).

The back surface of the holding region 331 (surface facing the emission surface 33a) and the polarizing plate forming the emission surface 33a are fixed with each other directly or via a material having a thermal conductivity higher than that of air. In FIG. 5, the LCD plate 33b abuts on the emission surface 33a, meanwhile, the LCD plate 33b may be attached to the emission surface 33a via a material 38 whose thermal conductivity is higher than that of air as illustrated in FIG. 8.

The intermediate region 332 is formed as a plane substantially parallel to the plane including the emission surface 33a, and arranged at a position off the optical path of the image light to be emitted from the emission surface 33a. A lower end of the intermediate region 332 (end portion located on the side opposite to the holding region 331) is in direct contact with the heat sink 31b, or in non-direct contact with the heat sink 31b via a material having a thermal conductivity higher than that of air.

A type of the "material having a thermal conductivity higher than that of air" is arbitrary as long as the material can form an emission surface exhaust heat path configured to allow the heat to be dissipated from a region of the emission surface 33a which is exposed to air, and have a heat gradient greater than a heat transfer path for transferring heat to the heat sink 31b by using air as a medium. In the emission surface exhaust heat path, the heat is transferred from the emission surface 33a to the heat sink 31b through the holding region 331 and the intermediate region 332 of the LCD plate 33b. For example, the "material having a thermal conductivity higher than that of air" may be a metal material such as aluminum, copper, and iron, or a non-metal material such as ceramic, carbon, and silicon.

The LCD plate 33b is formed of one member, and provided thereon with an opening for forming an optical path of the image light. The LCD plate 33b is also provided on a part thereof with the holding region 331, and provided on another part thereof with the intermediate region 332. On the LCD plate 33b, the holding region 331 is brought into direct contact (close contact) with the peripheral portion of the emission surface 33a, and the intermediate region 332 is brought into direct contact (close contact) with the heat sink 31b. In this connection, the one member referred herein does not necessarily mean a structure which is formed in a planar shape by using a single plate member, but includes any structure as long as it is formed of a single member and does not have an interfacial thermal resistance caused by connection of a plurality of members within the LCD plate 33b.

Since the LCD plate 33b is formed of a single plate member, an interfacial thermal resistance does not occur between the holding region 331 and the intermediate region 332. As a result, it is possible to suppress the interface thermal resistance of the emission surface exhaust heat path extending from the emission surface 33a to the heat sink 31b to the total value of an interface thermal resistance from the emission surface 33a to the LCD plate 33b and that from the LCD plate 33b to the heat sink 31b, thereby improving the thermal conductivity more than a case of forming the emission surface exhaust heat path through other members.

Figure 6:
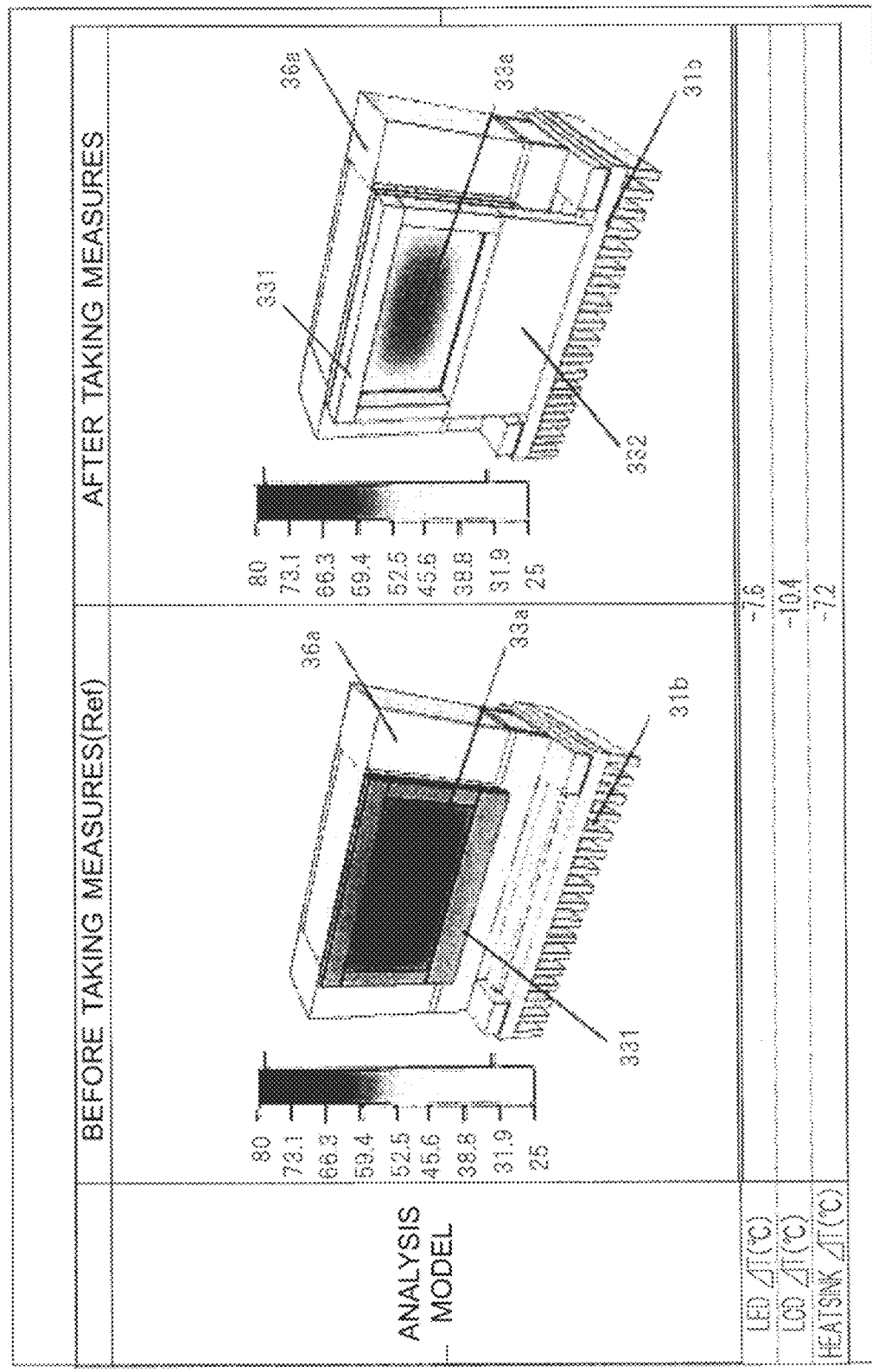
FIG. 6 illustrates a comparative example in which cooling performance of an image display device having heat generation countermeasure components according to the present embodiment is compared with that of a conventional image display device.

FIG. 6 illustrates a comparative example in which cooling performance of the image display device 30 having heat generation countermeasure components according to the present embodiment is compared with that of a conventional image display device. FIG. 6 illustrates a conventional image display device (hereinafter, referred to as a "conventional device") on its left side while illustrating the image display device 30 according to the present embodiment on its right side. These two image display devices are placed in the same environmental conditions, and then each backlight 31a is turned on. As a result, in a predetermined test condition (for example, as a test condition, using the energy of sunlight condensed on the LCD at an environmental temperature 25° C.), the surface temperature of the emission surface 33a of the image display device 30 according to the present embodiment is lower than that of the conventional device by 7.6 degrees, the surface temperature of the backlight 31a of the image display device 30 is lower than that of the conventional device by 10.4 degrees, and the surface temperature of the heat sink 31b is lower than that of the conventional device by 7.2 degrees, respectively. This result shows that the structure provided with the emission surface exhaust heat path improves not only the cooling performance of the emission surface 33a, but also the cooling performance of the backlight 31a and the heat sink 31b.

According to the present embodiment, the heat on the emission surface 33a is guided to the heat sink 31b via the LCD plate 33b, and thus can be efficiently dissipated to the outside of the outer housing 50. As a result, it is possible to suppress the temperature rise of the emission surface 33a.

Furthermore, in the present embodiment, the heat sink 31b which is a member provided in advance as a heat countermeasure of the backlight 31a is used to dissipate the heat on the emission surface 33a. As a result, a member provided thereon in advance can be effectively used to suppress the temperature rise of the emission surface 33a.

Still further, in the present embodiment, the intermediate region 332 of the LCD plate 33b is provided between the holding region 331 and the heat sink 31b. Since this space has not been effectively used in the prior art, in other words, this region is an empty area, the emission surface exhaust heat path can be formed without reducing the space inside the outer housing 50 (without changing arrangement positions of other members). As a result, it is possible to suppress the temperature rise on the emission surface 33a without changing the size of the outer housing 50.

Furthermore, connecting the LCD plate 33b to the heat sink 31b increases a heat capacity of the heat sink 31b. As a result, the heat sink 31b can improve a cooling effect of the backlight 31a.

The present invention is not limited to the embodiment described above, and various modifications can be made as long as they are not departing from the concept of the invention. For example, the embodiment described above has been explained in detail in order to clarify the present invention, but is not necessarily limited to those having all the configurations described. In addition, a part of the configuration of the present embodiment can be replaced with that of another embodiment, and the configuration of another embodiment can be added to the configuration of the present embodiment. Furthermore, it is possible to add, delete, or replace another configuration with respect to a part of the configuration of the present embodiment.

For example, in the image display device 30 according to the embodiment above, the backlight 31a is formed of a surface light source, and since a surface of the surface light source and the emission surface 33a are arranged on different planes, the optical path until the divergent light enters the emission surface 33a includes an inflection point at the position of the light guide 32b.

Figure 7:
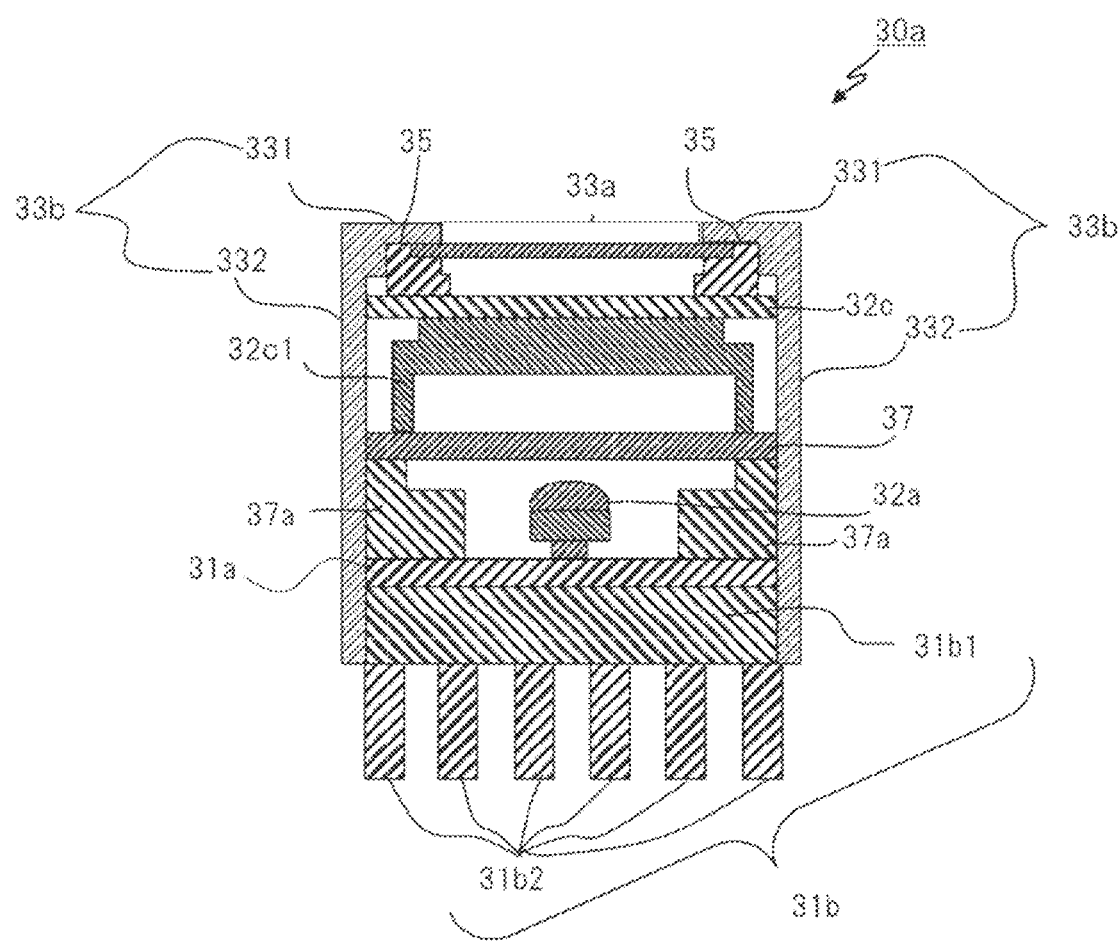
FIG. 7 is a cross-section view of an example of an image display device including an LCD plate (heat generation countermeasure components).

On the other hand, the present invention also can be applied to so-called a direct projection type image display device 30a as illustrated in FIG. 7, which allows the light emitted from the backlight 31a to enter the emission surface 33a without bending the optical path of the light. The image display device 30a of FIG. 7 includes the light funnels 32a approximately on the center of the width direction of the backlight 31a (lateral direction of FIG. 7), and includes a lens holding housing 37a on each end in the width direction of the backlight 31a. The lens holding housing 37a holds the lens 37 at the side opposite to the backlight 31a.

On an emission surface of the lens 37, a diffusion plate holding housing 32c1 which stands in contact with each end of the lens 37 along the radial direction thereof is provided. The diffusion plate holding housing 32c1 holds the diffusion plate 32c at the side opposite to the lens 37. The diffusion plate 32c is in contact with the frame 35 at the side opposite to the diffusion plate holding housing 32c1, and the frame 35 holds the emission surface 33a.

The light emitted from the backlight 31a passes through the light funnels 32a, is condensed by the lens 37, diffused by the diffusion plate 32c, and emitted through the emission surface 33a.

As described above, in the image display device 30a, the emission surface 33a is located at the side opposite to the heat sink 31b via the backlight 31a which serves as a heating element. Accordingly, the intermediate region 332 of the LCD plate 33b surround each side of the backlight 31a to connect the holding region 331 with the heat sink 31b. As a result, an emission surface exhaust heat path can be formed even in the case where the positional relationship between the heat sink 31b and the emission surface 33a is different from that of the embodiment above, thereby making it possible to dissipate the heat from the heat sink 31b.

In the case of an image display device 30b illustrated in FIG. 8, the heat sink 31b is not provided on an extended surface of the emission surface 33a, but on a position off the extended surface thereof. Even the image display device 30b configured as above can form an emission surface exhaust heat path when the intermediate region 332 of the LCD plate 33b connects the holding region 331 with the heat sink 31b. As a result, regardless of the shape of the heat sink 31b and a position thereof with respect to the emission surface 33a, it is possible to form the emission surface exhaust heat path.

Furthermore, the intermediate region 332 of the LCD plate 33b may be connected to the heat sink 31b not only directly, but also via a heat conductive sheet formed of a material having a thermal conductivity higher than that of air.

REFERENCE SIGNS LIST

1: HUD
2: vehicle
3: wind shield
5: driver
30: image display device
30a: image display device
30b: image display device
31a: backlight
31b: heat sink
32a: light funnel
32b: light guide
32c: diffusion plate
32c1: diffusion plate holding housing
33: display element
33a: emission surface
33b: LCD plate
34: flexible cable
35: frame
36a: outer member
36b: outer member
37: lens
37a: lens holding housing
40: virtual image optical system
41: concave mirror
42: mirror drive unit
43: lens unit 50: outer housing
51: outer cover portion
52: antiglare plate
53: optical component holding member
54: outer case
70: main substrate
80: virtual image
331: holding region
332: intermediate region

The invention claimed is:

1. A head up display for displaying a virtual image to a driver, the head up display comprising:
   an image display device that includes a backlight, a liquid crystal panel, and a plate for holding a periphery of an emission surface, from which an image light is emitted, provided on the liquid crystal panel;
   a virtual image optical system that includes a lens for transmitting the image light emitted from the liquid crystal panel, and a concave mirror for reflecting the image light to form an optical path of the image light;
   a housing that accommodates the virtual image optical system; and
   a heat sink that dissipates heat generated from the backlight,
   the heat sink being arranged in a state where at least a portion thereof is exposed to an outside of the housing,
   the plate being formed of a material having a thermal conductivity higher than that of air and provided with an emission surface exhaust heat path, and
   the emission surface exhaust heat path being formed to:
   include a holding region fixed to the periphery of the emission surface directly or via a material having a thermal conductivity higher than that of air, and an intermediate region connecting the holding region and the heat sink;
   connect an end portion, which is opposite to the holding region, of the intermediate region with the heat sink directly or via a material having a thermal conductivity higher than that of air;
   extend from the emission surface to the heat sink via the plate; and
   have a thermal gradient greater than that of a heat transfer path for transferring the heat from the emission surface to the heat sink by using air as a medium.

2. The head up display according to claim 1, wherein
the heat sink is arranged on a position off the optical path of the image light emitted from the emission surface, and
the plate is formed of a single member provided with an opening equal to or larger than a size of the emission surface.

3. The head up display according to claim 2, wherein
the heat sink is arranged on a position intersecting an extended surface of the emission surface, and
the plate is formed of a planar member provided with an opening equal to or larger than the size of the emission surface.

4. The head up display according to claim 1, wherein
the heat sink includes fins exposed to the outside of the housing, and a heat transfer plate that is accommodated in the housing and transfers the heat generated from the backlight to the fins, and
the backlight is arranged in contact with the heat transfer plate.

* * * * *